US00RE34162E

United States Patent [19]

Boyd, Jr.

[11] E Patent Number: Re. 34,162

[45] Reissued Date of Patent: Jan. 19, 1993

[54] CONTROLLED SURFACE ELECTRICAL RESISTANCE CARBON FIBER SHEET PRODUCT

[75] Inventor: George P. Boyd, Jr., Attleboro, Mass.

[73] Assignee: Zoltek Corporation, St. Louis, Mo.

[21] Appl. No.: 483,531

[22] Filed: Feb. 20, 1990

Related U.S. Patent Documents

Reissue of:

[64] Patent No.: 4,728,395
Issued: Mar. 1, 1988
Appl. No.: 660,051
Filed: Oct. 12, 1984

[51] Int. Cl.[5] ..... D21H 13/50

[52] U.S. Cl. ..... 162/138; 162/145; 162/146; 162/157.1; 162/168.1; 264/29.2; 264/29.7; 423/447.1; 423/447.2; 423/447.8; 428/224; 428/408; 428/409

[58] Field of Search ..... 162/138, 145, 146, 157.1, 162/207, 168.1; 264/29.2, 29.7; 428/409, 224, 408; 423/447.1, 447.2, 447.8

[56] References Cited

U.S. PATENT DOCUMENTS

| | | | |
|---|---|---|---|
| 3,174,895 | 3/1965 | Gibson et al. | 264/29.7 |
| 3,265,557 | 8/1966 | DeFries et al. | 162/146 |
| 3,484,183 | 12/1969 | Dickson et al. | 162/138 |
| 3,682,595 | 8/1972 | Okuda et al. | 162/145 |
| 3,998,689 | 12/1976 | Kitago | 162/175 |
| 4,080,413 | 3/1978 | Layden et al. | 162/138 |
| 4,336,022 | 1/1982 | Lynch et al. | 264/29.7 |
| 4,364,916 | 12/1982 | Kalnin et al. | 264/29.2 |
| 4,490,201 | 12/1984 | Leeds | 264/29.7 |
| 4,526,770 | 7/1985 | Pepper et al. | 264/29.7 |

FOREIGN PATENT DOCUMENTS

| | | | |
|---|---|---|---|
| 125616 | 12/1974 | Japan | 162/145 |
| 717204 | 2/1980 | U.S.S.R. | 162/138 |
| 1535440 | 12/1978 | United Kingdom | 264/29.7 |

OTHER PUBLICATIONS

Otani, "On the Carbon Fiber from the Molten Pyrolysis Products", *Carbon*, (1965), vol. III, pp. 31-38.

*Primary Examiner*—Peter Chin
*Attorney, Agent, or Firm*—Charles W. Helzer

[57] ABSTRACT

A method of manufacturing controlled *surface* electrical resistivity carbon fiber sheet products employing a carbonizable starting material, heating and drawing the starting material (if required), *stabilizing and* oxidizing the starting material *if required* at an elevated temperature of the order of 220 degrees Centigrade to effect molecular aromatic rearrangement of the starting material, *partially* carbonizing the oxidized starting material at [an] elevated temperature *values* in an oxygen free atmosphere within a furnace having an elevated temperature extending over a temperature range *from about 370 degrees Centigrade* to about 1400 degrees Centigrade [by soaking the]. *The* starting material *is soaked* at an elevated temperature for a predetermined period of time to provide a *known* preselected *surface* electrical resistivity to the *partially* carbonized material *corresponding to that required to provide the preselected desired surface electrical resistance for the finished products.* The *partially* carbonized material thus treated is formed into [end] carbon fiber sheet products [having] the form of paper, woven fabric and the like having a *predetermined* desired *surface* electrical [resistivity] *resistance.* The starting carbonizable material consists essentially of PAN.

40 Claims, 3 Drawing Sheets

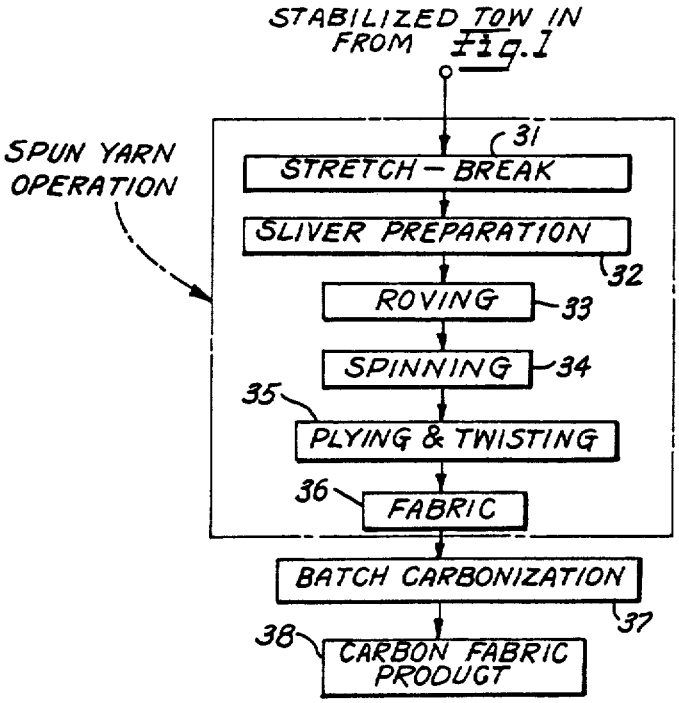
Fig. 2
ELECTRICAL RESISTIVITY AS A FUNCTION OF HEAT TREATMENT TEMPERATURE
Fig. 3
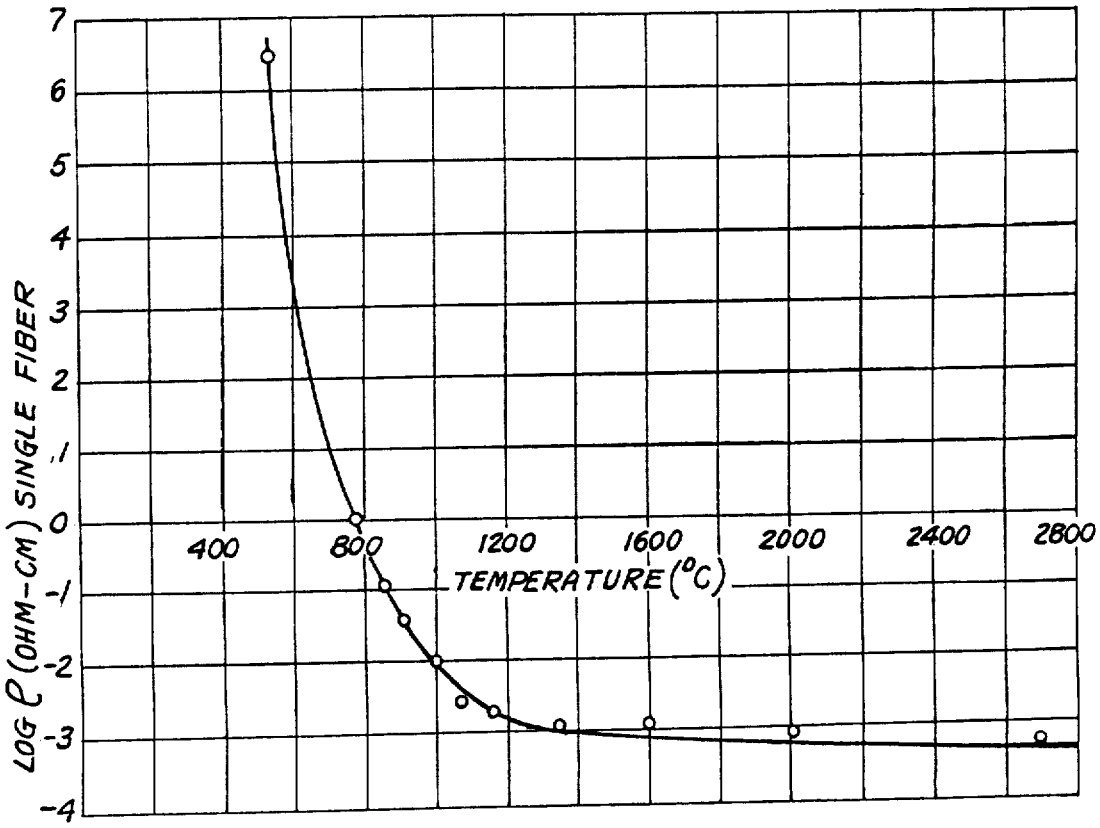

CONTROLLED SURFACE ELECTRICAL RESISTANCE CARBON FIBER SHEET PRODUCT

Matter enclosed in heavy brackets [ ] appears in the original patent but forms no part of this reissue specification; matter printed in italics indicates the additions made by reissue.

TECHNICAL FIELD

This invention relates to a novel method of manufacture of *homogeneous partially carbonized* controlled [resistivity] *surface resistance* carbon fiber paper and fabric sheet products composed of *homogeneous partially carbonized* controlled [surface] *electrical volume* resistivity carbon fibers and to the products resulting therefrom.

BACKGROUND PRIOR ART

Both woven and non-woven fiber mats employing carbon fibers have been fabricated in the past for a variety of purposes such as in the electromagnetic interference (EMI) shielding of radios in automobiles. One of such known prior art [product] *products* and method of manufacture thereof, is described in an article entitled "Conductive Fiber Mats as EMI Shield for SMC" (sheet molding compounds), by J. R. Quick and Z. Mate appearing in "Modern Plastics" —published May, 1982, pages 68–71. In this article, a number of SMC products employing panels molded from non-woven carbon fiber mats is described wherein the non-woven carbon fiber mats employ either 100% carbon fibers, 50% carbon fiber and 50% glass or 33% carbon fiber and 67% glass fiber in their makeup. Similar arrangements are also known in the art wherein the fabric being formed is woven by known weaving techniques, knitting or the like employing varying percentages of carbon fiber filament and glass fiber filaments. From one of the tables included in the article it is clear that the electrical surface resistance measured in ohms per square increases with decreasing carbon filament content and increasing glass fiber filament content. However, this method of interspersing glass filaments with carbon filaments to control the resulting surface resistance of the resulting sheet product at best can only achieve stepped increases in the *surface* resistance. As is well known to those skilled in the art, the surface [resistivity] *resistance* of a product is in inverse relationship to its conductivity. Thus, where it is desired to finely control the *surface* electrical [resistivity] *resistance* (conductivity) of a given sheet product, the technique of interspersing glass fiber filaments with conductive filaments of either carbon, aluminum or the like to achieve a desired [resistivity] *surface resistance* (conductivity) is at best a gross technique requiring much experimentation and adjustment and more often than not resulting in a product having less than optimum values of electrical [resistivity] *surface resistance* (conductivity) which are not uniformly dispersed within the sheet. To overcome this problem, the present invention was made.

SUMMARY OF INVENTION

It is therefore a primary object of the present invention to provide a new and improved method of fabricating controlled *surface* electrical [resistivity] *resistance homogeneous partially carbonized* carbon fiber sheet products employing carbonizable fiber starting materials which thereafter are specially treated to result in finished *homogeneous partially carbonized* carbon fiber sheet products having a desired preselected *surface* electrical [resistivity] *resistance* within a wide range of values and which is uniformly dispersed throughout the [carbon] *homogeneous partially carbonized* fiber sheet product. *The sheet products are homogeneous in nature because they are comprised only of partially carbonized fiber material and require no insulating elements such as glass fiber in order to adust the surface resistance of the sheet products to a desired surface resistance value.*

Another object of the invention is to provide such a method of manufacture and *homogeneous partially carbonized* products produced thereby which results in novel sheet products in paper form, woven fabric form and the like and which have a desired *surface* electrical [resistivity] *resistance* selected from a wide range of obtainable *surface* electrical [resistivity] *resistance* values uniformly dispersed throughout the sheet product.

In practicing the invention, a novel method of manufacturing controlled [resistivity] *surface resistance* carbon fiber sheet products is provided which employs carbonizable starting material in a textile fiber form. The method preferably comprises first heating and drawing the carbonizable starting material; however, if the initial starting material is a carbonizable material either in continuous tow or continuous yarn form of a small dpf (denier per filament) of the order of 1.5 dpf, then the initial step of heating and drawing the starting material can be eliminated. After heating and drawing the carbonizable material is oxidized at an elevated temperature of the order of 220 degrees Centigrade to effect aromatic molecular rearrangement of the starting material. *In the event the precursor starting material previously has been stabilized and oxidized by a supplier of such material, then this step may be eliminated.* The resulting oxidized *starting* material is composed of about 62% carbon, 22% nitrogen, 11% oxygen and 5% hydrogen and has a density of about 1.36 grams per cubic centimeter. The material then is *partially* carbonized at an elevated temperature in an oxygen free atmosphere either in a vacuum or an inert gas within a furnace having a continuously increasing temperature profile to a maximum temperature in the furnace and which extends over a temperature range up to about 1400 degrees Centigrade. During *the partial* carbonization, the material is soaked at the elevated temperatures while continuously moving therethrough at a relatively low rate of travel so as to assure a prescribed temperature-time heat treatment of the order of ten to twenty minutes to provide a *known electrical volume resistivity which will result in a finished sheet product having a desired* preselected *surface* electrical [resistivity to the resulting carbonized fiber material] *resistance*. Alternatively, similar treatment can be achieved in a batch furnace. The *partially* carbonized fiber material *then* is [then] formed into a desired end sheet product having the form of paper, woven fabric and the like.

The starting carbonizable material used in practicing the invention consists essentially of polyacrylonitrile (PAN).

If the resulting [sheet] product is to be in a paper *sheet* form, then the *partially* carbonized starting material resulting from the carbonizing treatment described above is chopped into bundles of fine carbon fibers having a length of from ⅛ to 1 inch which then are supplied to a mixer for mixing with water in copious quantities to form a slurry exclusive of the water comprised of about 83% carbonized fibers, 14% dispersant fiber such as cellulose, 2% polyvinylalcohol (PVA) and the remainder a resin to result in a highly dilute solution wherein the [constitutents] *constituents* of the slurry exclusive of the water amount to about 0.12% of the overall slurry solution including the water. The overall slurry solution then has ammonia added to adjust the Ph factor of the solution to a value of about 8–9. The slurry solution is then supplied to a wet lay paper formation process to form wet sheets of carbon fibre paper. The wet sheets of carbon fiber paper are then conveyed to a series of dryer cans and then taken up continuously on a take-up roll for storage and use.

If the initial carbonizable material is in the form of 1.5 denier per filament (dpf) yarn or less, *and/or previously has been stabilized and oxidized,* then as noted earlier the [step] *steps* of heating and drawing , *and/or stabilizing and oxidizing* the starting material can be eliminated, and the step of forming the *partially* carbonized material into a desired end sheet product may comprise weaving the *partially* carbonized yarn into a *partially* carbonized sheet product having a preselected desired surface electrical [resistivity] *resistance.*

A carbon fiber sheet product having a preselected surface electrical [resistivity] *resistance* manufactured according to the invention also can be provided by a different procedure which employs carbonizable fiber starting material such as PAN in tow form. This different procedure comprises heating and drawing the starting material, oxidizing the heated and drawn starting material at an elevated temperature of the order of 220 degrees Centigrade to effect aromatic rearrangement of the molecules of the starting material and thereby form a stabilized tow. *If a stabilized tow can be purchased from a supplier then these steps would not be required.* The tow is then stretch-broken and formed into sliver comprising large bundles of discontinuous filaments of the starting material. The sliver is then aligned and the ends thereof joined into a roving in a slightly twisted condition. The roving then is spun and formed into yarn which then is plied or twisted. The plied or twisted spun yarn then is woven or knitted into a fabric. The fabric thus formed *then* is *partially* carbonized at an elevated temperature in an oxygen free vacuum or inert atmosphere within a furnace having an increasing temperature within the furnace extending over a temperature range from ambient to about 1400 degrees Centigrade. The fabric is soaked within this elevated temperature range for a period of time in accordance with a prescribed temperature-time schedule of the order of seven to ten hours and then force cooled back to ambient to provide a preselected surface electrical resistivity to the *partially* carbonized fabric.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference character, and wherein:

FIG. 2 is a schematic functional block diagram of an alternative spun yarn which can be used in conjunction with the initial processing steps of the system and method of practicing the invention shown in FIG. 1 to result in a controlled resistivity carbon fiber sheet product in fabric form manufactured according to the invention;

FIG. 3 is a temperature-resistivity curve plotted in log form and showing the electrical *volume* resistivity of a single carbonized fiber filament treated according to the invention.

BEST MODE OF PRACTICING THE INVENTION

Figure 1:
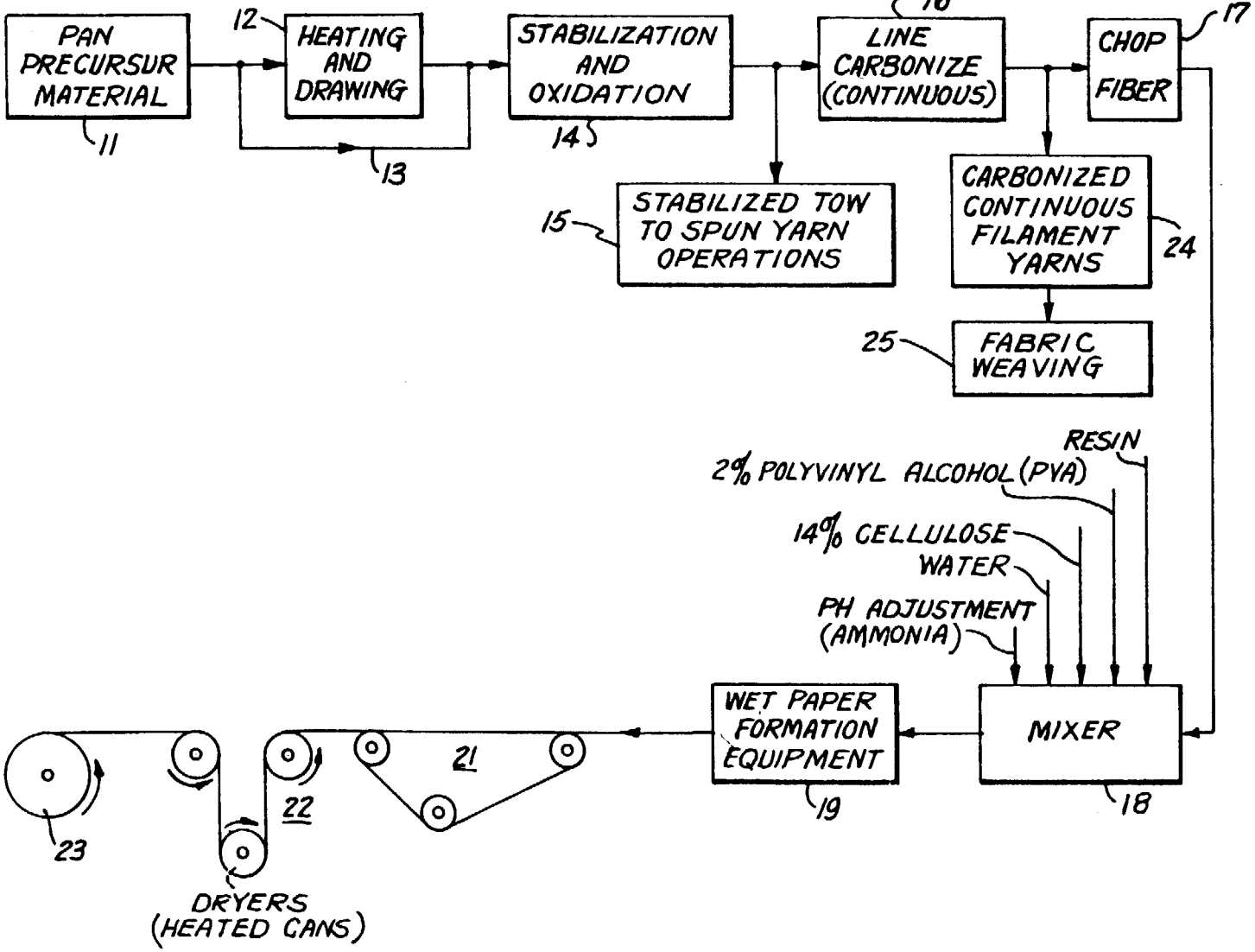
FIG. 1 is a functional block diagram depicting the essential and certain alternative steps employed in practicing the method of manufacturing controlled resistivity carbon fiber sheet products according to the invention.

The novel method of manufacturing *homogeneous* controlled [resistivity] *surface resistance partially* carbonized fiber sheet products according to the invention includes a source of carbonizable precursor material comprising PAN (polyacrylonitrile) is shown at 11. The precursor material generally used is in plaited tow form as shipped from the supplier.

The precursor material is supplied to a commercially available heating and drawing stage shown at 12 where the material is heated to a temperature of about [1500] *150* degrees Centigrade and drawn at a ratio dependent upon the desired size of the output tow. For example, a tow having dimensions ranging from 160,000 filament bundles times 3 dpf (where dpf is denier per filament and a denier is the number of grams of material in 9,000 meters of the material), would be drawn down to a tow of 1.5 dpf or less having 160,000 filaments per bundle dependent upon the draw ratio.

From the heating and drawing operation at 12, the carbonizable tow is supplied to an oxidization operation 14 where it is stabilized by being heated in atmospheric oxygen to a temperature of about 220 degrees Centigrade and results in the aromatic molecular rearrangement of the material. In the case of PAN, the resulting oxidized tow has a composition of about 62% carbon, 22% nitrogen, 11% oxygen and 5% hydrogen with a density of about 1.36 grams per cubic centimeter. The resulting oxidized tow is sold under the trademark "PYRON". During the oxidation phase the tow changes color from white or off-white to black and undergoes a change in density although the carbon content remains essentially the same. The time required for the stabilization is about two to three hours. Ovens for this purpose are commercially available.

For certain types of operations, it may be desirable to start with a PAN precursor material which is initially supplied in continuous yarn form having a filament of 1.5 dpf or less and a filament count of up to 20,000 filaments per bundle. For such operations, it is not necessary to include the heating and drawing operation and hence this operation will be bypassed as indicated by the line 13 in FIG. 1. This is particularly advantageous for the production of sheet products in fabric form. *In*

*the event the pan presurser material introduced at 11 previously has been stabilized and oxidized by the supplier, then the step shown at 14 can be bypassed.*

The oxidized tow produced by the heating and drawing and oxidization operations 12 and 14 as described above and marketed as "PYRON" is employed in the further processing required to form sheet products. If the sheet product desired is to be in the form of fabric as in woven or knitted fabric, the "PYRON" is supplied as an input tow to an oxidized spun yarn operation indicated at 15 to be described more fully hereinafter with relation to FIG. 2 of the drawings. However, if the sheet product to be produced is in paper form, the "PYRON" tow is supplied directly to the input of a continuous line carbonizer 16.

The line carbonizer 16 comprises an on-line, extended length furnace having a temperature profile which gradually increases from the input to the output end thereof and through which the "PYRON" tow is passed continuously. The continuous line carbonizer 16 typically may be about 80 feet in length and is divided into four temperature zones whose temperatures gradually increase from about 370 degrees Centigrade for the first zone at the entrance to the oven to 650 degrees Centigrade for the second zone, 790 degrees Centigrade for the third zone and at last zone going up to 1,400 degrees Centigrade as required for the particular carbonizing operation being conducted. The carbonization takes place in an inert gas atmosphere such as nitrogen or argon. The rate of travel of the tow through the line carbonizing furnace 16 is adjusted such that it is soaked at the elevated temperatures indicated for an overall period through all of the temperature zones of about ten to twenty minutes. The operation is designed to achieve pyrolysis of the tow continuously passing through the furnace. Suitable continuous-line carbonizers for use as furnace 16 are commercially available.

FIG. 3 is a graph showing the electrical resistivity of a single carbon fiber filament as a function of heat treatment of the "PYRON" tow in the carbonizing operation achieved in the line carbonizing furnace 16 as described above. The change in resistivity of a carbon fiber filament with increasing temperature previously has been reported in an East German publication entitled "Plastic Und Kautschuk"-Volume 27, No. 6, 1980, pages 309-313, Brehmer, Pinnow and Ludwig—Published by the Institute of Polymer Chemistry—Academy of Sciences of the German Democratic Republic—Teltow—Seehof. In FIG. 3, the maximum temperature within the furnace is plotted as the [abcissa] *abscissa* and the resistivity of the carbonized fiber filament is plotted as the ordinate in ohm centimeters on a logarithmic scale. As illustrated in FIG. 3, the portion of the curve extending from about 1300 degrees Centigrade upward flattens out so that any change in resistivity induced in a single carbon fiber filament at the higher temperatures is essentially nil for the considerable increases in temperature required to drive them to the points in question. However, in that portion of the curve extending from about 670 degrees C. to 1400 degrees C. quite a wide range of electrical resistivities can be achieved for the single carbon fiber filament over this range of temperature values by appropriate selection of a temperature-time soaking period dependent upon the total denier of the incoming "PYRON" tow. For example, an incoming "PYRON" tow having a filament count of 320,000 times 1.5 dpf would require a residence time within the furnace of about fifteen to twenty minutes. An incoming "PYRON" tow of 160,000 times 1.5 dpf would have a residence period of ten to twelve minutes.

If it is desired to produce carbon fiber paper sheet product having a preselected electrical surface resistance, the carbonized tow produced at the output of the line carbonizer 16 is supplied to a chopping apparatus 17 where the fibers are chopped into lengths which may extend from ⅛th to 1 inch but are preferably of the order of ¼ inch. Suitable chopping equipment for this purpose is sold commercially. The chopped fibers are supplied to a mixer 18 along the copious amounts of water to form a slurry whose composition, exclusive of the water, is about 83% chopped carbon fiber having a preselected electrical resistivity determined by the line carbonization treatment 16, 14% cellulose or other known binder fiber, 2% polyvinylalcohol (PVA) and the remainder viscosity modifier resin. The mixer 18 thoroughly mixes all these [constitutuents] *constituents* into an extremely dilute slurry solution wherein the [constitutuents] *constituents* listed above constitute about 0.12% of the overall slurry solution including the water. Before treating the slurry solution further as described hereafter, the PH of the solution is adjusted to a PH factor of about 8 to 9 by the addition of ammonia. Satisfactory mixers for use as mixer 18 are manufactured and sold commercially.

From mixer 18, the dilute slurry is supplied to a wet paper formation process using equipment 19 such as that described in a textbook entitled "Synthetic Fibers and Paper Making"—edited by O. A. Battista and published by Interscience Publishers, a division of John Wylie & Sons, Inc., New York, N. Y.—copyrighted 1964 by John Wylie & Sons, Inc.—Library of Congress Catalog Card #64-13211. The wet paper processing equipment 19 produces wet paper stock that is transported by a conveyor 21 to a series of driers comprised by heated cans 22 and then supplied to a take-up roll 23 for storage and subsequent use.

Figure 4:
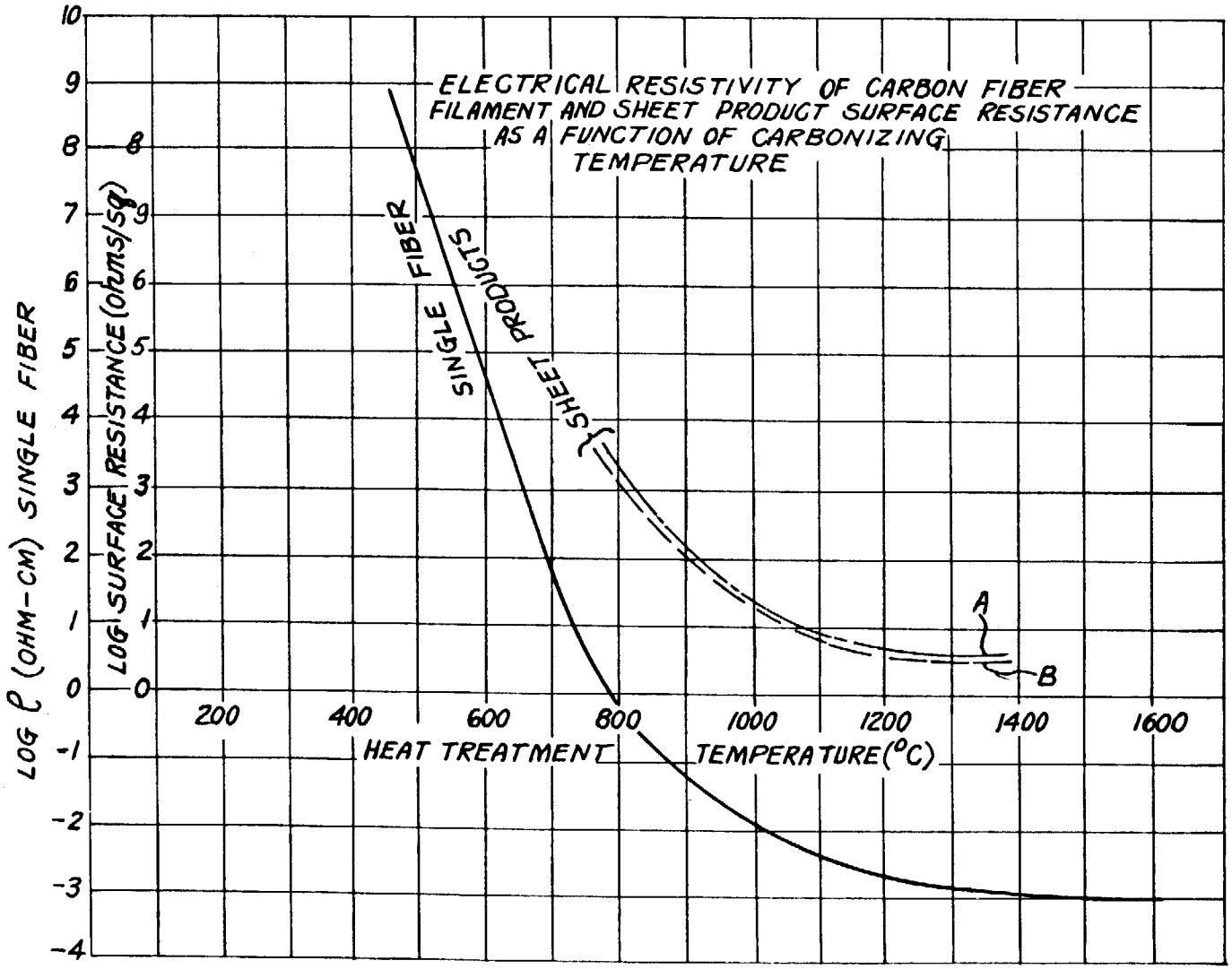
FIG. 4 is a composite curve showing both the *electrical volume* resistivity versus heat treatment temperature characteristics of a single carbonized fiber filament and the resulting surface resistance of a carbonized sheet product fabricated according to the invention and illustrates data with which the temperature-resistivity of the single carbonized fiber is translated into the *preselected desired* surface resistance of the resultant *partially* carbonized fiber sheet product produced with such fibers.

FIG. 4 is a characteristic curve showing the heat treatment temperature plotted as the [abcissa] *abscissa* and both the log of the resistivity in ohm centimeters for a single carbon fiber filament and the logarithm of the electrical surface resistance measured in ohms per square plotted as ordinates on scales indicated to the left in FIG. 4. The surface resistance for two different weight carbon fiber sheet products produced according to the method illustrated in FIG. 1 are shown plotted by a solid line curve A for a one-half ounce per square yard sheet and a dash-dot curve B for a one ounce per square yard sheet, over the range of heat treatment temperatures shown. To produce a sheet product having a desired value surface resistance, the value of surface resistance obtained from either of the two curves A or B for the given weight sheet product there plotted, or a corresponding curve for any given weight carbonized fiber sheet product, the temperature to which the sheet product must be driven can be translated into a corresponding temperature that must be provided to the single fiber filament "PYRON" tow passing through the line carbonizer 16. In this manner the carbonizing temperature of the line carbonizer 16 can be adjusted to provide a resulting carbon fiber paper sheet product having a preselected surface resistance.

As mentioned earlier, the carbonized "PYRON" tow appearing at the output of the line carbonizing furnace 16 and supplied to the fiber chopping apparatus 17 for use in the carbon paper sheet product formation operation, is in the form of a carbonized continuous filament tow called "PANEX" tow. If desired, and provided that the initial starting PAN precursor material being used is in the form of a highly orientated 1.5 dpf or less continuous filament yarn, then the "PANEX" yarn output 24 from the line carbonizing furnace 16 will be in a form that may be woven into a carbon fiber fabric by a weaving operation shown at 25. The carbon fiber fabric sheet product weaving operation and the caroon fiber sheet product formation are mutually exclusive process steps due to the commonly used line carbonizer 16 so that only one or the other can be run at any particular time with the system shown in FIG. 1. Should the demand for such products occasion the need, separate manufacturing process lines can be set up by providing separate input front ends comprising the precursor starting material source 11, the heating and drawing operations 12 (where required), the oxidization processing 14 and a separate line carbonizing furnace 16 for each of the respective production lines.

At an earlier point in the description of FIG. 1, it was indicated that the oxidized tow (known as "PYRON") produced at the output of the oxidation operation 14 could be supplied either to the line carbonizer 16 as described above or, alternatively, it could be supplied to a spun yarn operation 15 shown in block diagram form in FIG. 2. Referring to FIG. 2, it will be seen that the stabilized "PYRON" tow is first supplied to a stretch-break machine 31 which also is referred to as a tow-to-top converter in the art and is commercially available. In the stretch-break operation, the stabilized "PYRON" tow is passed through a series of stretching rollers which are spaced apart at gradually reducing distances and then broken into lengths of about six to eight inches.

From the stretch-break operation 31 the discontinuous length filaments of stabilized tow are supplied to a sliver preparation operation 32 where they are joined together in large bundles of discontinuous filaments in an untwisted condition. Suitable machinery for performing the sliver preparation operations are available commercially. The sliver is then supplied to a roving machine 33 of a type commercially available where the sliver is processed into a roving. Roving produced at the output of the operation 33 is then supplied to a spinning machine 34 also commercially available. The spinning machine 34 converts the roving into a spun yarn produced at the output of the spinning operation 34. The spun yarn is supplied to a commercially available plying and twisting machine 35 where it is piled or twisted to prepare it for [a] weaving, knitting or other similar operations. The plied or twisted spun yarn then is supplied to a fabric weaving operation 36, a knitting or other fabric forming operation which provides a fabric of desired characteristics for an intended end application. From the fabric forming operation, the fabric is then supplied to a batch carbonization treatment furnace 37 where the fabric is carbonized at an elevated temperature in a vacuum within the furnace whose temperature increases from ambient up to a selected temperature of about 1400 degrees Centigrade and then is force cooled back to ambient over a period of about three to four days. The fabric is soaked at the elevated temperatures pursuant to the temperature-surface resistance treatment schedule depicted in FIG. 4 of the drawings in order to provide the fabric with a preselected electrical surface resistance. After carbonization in the above described manner, the output carbonized fabric sheet product is then accumulated as on a take-up roll shown at 38.

The resulting carbon fiber sheet products formed either by the manufacturing steps illustrated and described with relation to FIG. 1 or those shown in FIG. 2 are sold under the trademark "PANEX" and can be supplied with electrical resistivities of any value within the range of values depicted in FIG. 4. Because the temperature-resistivity treatment schedule provides a substantially linearly changing *volume* electrical resistivity for each incremental increase in temperature during the soak period, carbon fiber sheet products having precise and evenly distributed *surface* electrical [resistivities] *resistances* can be manufactured in accordance with the invention.

INDUSTRIAL APPLICABILITY

A method of fabricating controlled *surface* electrical resistivity carbon fiber sheet products is described which employs carbonizable fiber filament starting materials which [thereafter] are heat treated in a furnace at *preselected* elevated temperatures in an oxygen free atmosphere *and thereafter further processed* to result in finished *homogeneous* carbon fiber sheet products having a desired preselected *surface* electrical [resistivity over a wide range of values and which is uniformly disbursed throughout the carbon fiber sheet product] *resistance.*

Having described several embodiments of a novel method of fabricating controlled *surface* electrical [resistivity] *resistance* carbon fiber sheet products and the products resulting therefrom in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A method of manufacturing a plurality of different value controlled resistivity carbon fiber sheet products employing a carbonizable fiber starting material; said method comprising [oxidizing and stabilizing the carbonizable fiber starting material at an elevated temperature of the order of 220 degrees Centigrade to effect molecular aromatic rearrangement of the fibers,] selectively *partially* carbonizing [the] *previously* oxidized and stabilized fiber starting material for a predetermined time period in an oxygen free atmosphere within a furnace at [a] selected temperature *values* within a temperature range from 370 degrees Centigrade to about 1300 degrees Centigrade by soaking the stabilized fiber starting material at the selected temperature for the predetermined period of time to provide a [desired] *preselected known volume* electrical resistivity to the *partially* carbonized fibers *corresponding to that volume electrical resistivity value required to provide the preselected desired surface resistance value for the finished sheet products*, and thereafter processing the *partially* carbonized fibers into [desired electrical resistivity] *homogeneous* carbon fiber sheet products [having the form of non-woven paper or woven or knitted fabric sheet products] having *the* preselected desired surface electrical [resistivities] *resistances.*

2. The method according to claim 1 wherein the [steps of heating and drawing the fiber] starting carbonizable *fiber* material [is added prior to] *is heated and drawn prior to* oxidizing and stabilizing the fibers.

3. The method according to claim 1 wherein the fiber starting carbonizable material consists essentially of polyacrylonitrile (PAN).

4. The method according to claim 2 wherein the fiber carbonizable starting material comprises polyacrylonitrile (PAN).

5. The method according to claim 1 wherein the step of processing the *partially* carbonized fiber material into a desired end sheet product comprises chopping the *partially* carbonized fiber material into bundles of fine fibers having a length of from ⅛ to 1 inch, supplying the chopped carbonized fibers to a mixer for mixing with water [in copious quantities] to form a slurry comprised of about 83% *partially* carbonized fibers, 14% cellulose, 2% polyvinylalcohol and the remainder a resin to result in a highly dilute solution wherein the constituents of the slurry exclusive of the water amount to about 0.12% of the overall slurry solution including water, adjusting the Ph factor of the overall slurry solution to a Ph factor of about 8-9 with ammonia, supplying the slurry solution to a wet lay paper formation process to form wet sheets of carbon fiber paper, conveying the wet sheets of carbon fiber paper to a series of dryer cans and taking up the sheets of dry carbon fiber paper sheets continuously on a take-up roll for storage and use.

6. The method according to claim 2 wherein the step of processing the *partially* carbonized fiber material into a desired end sheet product comprises chopping the *partially* carbonized fiber material into bundles of fine fibers having a length of from ⅛ to 1 inch, supplying the chopped *partially* carbonized fibers to a mixer for mixing with water in [copious] quantities to form a slurry comprised of about 83% *partially* carbonized fibers, 14% cellulose, 2% polyvinylalcohol and the remainder a resin to result in a highly dilute solution wherein the constituents of the slurry exclusive of the water amount to about 0.12% of the overall slurry solution including water, adjusting the Ph factor of the overall slurry solution to a Ph factor of about 8-9 with ammonia, supplying the slurry solution to a wet lay paper formation process to form wet sheets of carbon fiber paper, conveying the wet sheets of carbon fiber paper to a series of dryer cans and taking up the sheets of dry carbon fiber paper continuously on a take-up roll for storage and use.

7. The method according to claim 5 wherein the starting fiber carbonizable material consists essentially of polyacrylonitrile (PAN).

8. The method according to claim 6 wherein the starting fiber carbonizable material consists essentially of polyacrylonitrile (PAN).

9. The method of manufacture according to claim 1 wherein the carbonizable fiber starting material initially used comprises 1.5 dpf yarn and wherein the step of processing the *partially* carbonized fiber material into desired end carbon fiber sheet products comprises forming a continuous filament yarn and thereafter weaving the *partially* carbonized continuous filament yarn into fabric.

10. The method according to claim 9 wherein the starting fiber carbonizable material consists essentially of polyacrylonitrile (PAN).

11. A method of manufacturing a plurality of different value controlled resistivity carbon fiber sheet products employing [a] carbonizable, *previously oxidized and stabilized* fiber starting material; said method comprising [oxidizing and stabilizing the fiber starting material at an elevated temperature of the order of 220 degrees Centigrade to effect molecular aromatic rearrangement of the fibers,] forming [a] *an oxidized and* stabilized tow, stretching and breaking the stabilized tow, forming the stabilized stretched and broken fiber filaments into sliver comprised of, large bundles of discontinuous filaments in an untwisted condition, converting the sliver into roving, spinning the roving into a spun yarn, plying or twisting the spun yarn, weaving or knitting the plied and twisted spun yarn into fabric, and selectively *partially* carbonizing the fabric thus formed at [a] preselected elevated temperature *values* for a predetermined time period in an oxygen free atmosphere within a furnace having a continuously increasing temperature profile within the range from *about* 370 degrees Centigrade to about 1300 degrees Centigrade [by soaking the fabric at the preselected elevated temperature for the predetermined period of time] to provide a *known* preselected [surface] electrical *volume* resistivity to the *partially* carbonized *fiber filament in the* fabric *corresponding to that value of electrical volume resistivity required to provide the preselected desired surface resistance for the finished fabric.*

12. The method according to claim 11 wherein the step of heating and drawing the starting carbonizable fiber material is added prior to oxidizing the starting material.

13. The method according to claim 11 wherein the starting carbonizable fiber material consists essentially of polyacrylonitrile (PAN).

14. The method according to claim 12 wherein the starting carbonizable fiber material consists essentially of polyacrylonitrile (PAN).

15. A method of manufacturing a plurality of different value controlled [resistivity] *surface resistance* carbon fiber sheet products employing [a carbonized] *carbonizable previously oxidized and stabilized* fiber starting material; said method comprising [oxidizing and stabilizing the carbonizable fiber starting material at an elevated temperature of the order of 220 degrees Centigrade to effect molecular aromatic rearrangement of the fibers,] selectively *partially* carbonizing the stabilized fibers at [an] elevated temperature *values* in an oxygen free atmosphere within a furnace having an increasing temperature profile extending over a temperature range from *about* 370 degrees Centigrade to about 1300 degrees Centigrade by soaking the stabilized fibers at a preselected elevated temperature for a predetermined period of time in accordance with a prescribed temperature-time-resistivity schedule to provide a preselected *known* electrical *volume* resistivity to the *partially* carbonized fibers *corresponding to that required to provide the preselected desired surface resistance for the finished sheet products*, processing the *partially* carbonized fibers into desired end sheet products having preselected desired surface electrical [resistivities] *resistances*, and wherein the steps of processing the carbonized fibers into a desired end carbon fiber sheet product include chopping the selectively carbonized fibers into bundles of fine fibers having a length of from ⅛ to 1 inch, supplying the chopped carbonized fibers to a mixer for mixing with water in [copious] quantities to form a slurry comprised of about 83% carbonized fibers, 14% cellulose, 2% polyvinylalcohol and the remainder a resin to result in a highly dilute solution wherein the [constitutents] *constituents* of the slurry exclusive of the water amount to about 0.12% of the overall slurry solution including water, adjusting the Ph factor of the overall slurry solution of a Ph factor of about 8–9 with ammonia, supplying the slurry solution to a wet lay paper formation process to form wet sheets of carbon fiber paper, conveying the wet sheets of carbon fiber paper to a series of dryer cans and taking up the sheets of dry carbon paper continuously on a take-up roll for storage and use.

16. The method of manufacture according to claim 15 wherein the [method further comprises initially using as a] carbonizable fiber starting material *is* a 1.5 dpf yarn [and wherein the step of forming the carbonized fiber material into a desired carbon fiber sheet product further comprises forming a carbonized continuous filament yarn and thereafter weaving the carbonized continuous filament yarn into fabric].

17. The method according to claim 15 wherein the starting carbonizable fiber material consists essentially of polyacrylonitrile (PAN).

18. The method according to claim 16 wherein the starting carbonizable fiber material consists essentially of polyacrylonitrile (PAN).

19. The method according to claim 15 wherein the step of heating and drawing the starting carbonizable fiber material is added prior to oxidizing the carbonizable starting material.

20. The method according to claim 16 wherein the step of heating and drawing the starting carbonizable fiber material is added prior to oxidizing the carbonizable starting material.

21. The method according to claim 19 wherein the starting carbonizable fiber material consists essentially of polyacrylonitrile (PAN).

22. The method according to claim 20 wherein the starting carbonizable fiber material consists essentially of polyacrylonitrile (PAN).

23. The product of the process according to claim 1.

24. The product of the process according to claim 3.

25. The product of the process according to claim 5.

26. The product of the process according to claim 7.

27. The product of the process according to claim 9.

28. The product of the process according to claim 10.

29. The product of the process according to claim 11.

30. The product of the process according to claim 13.

31. The product of the process according to claim 15.

32. The product of the process according to claim 16.

*33. A method of manufacturing homogeneous controlled surface resistance carbon fiber sheet products which exhibit a predetermined surface electrical resistance from a carbonizable fiber starting material, the method comprising partially carbonizing previously oxidized and stabilized fiber starting material by subjecting it to a heat-soak treatment within a preselected temperature range for a predetermined time period in an oxygen-free atmosphere within a furnace and, either before or after the partial carbonizing step, processing the fibers into a desired product form; characterized in that the surface electrical resistance of the resulting finished product is time/temperature controlled during the partial carbonizing step so as to provide a predesigned electrical volume resistivity to the resultant partially carbonized fibers corresponding in value to a known preselected electrical volume resistivity value required to provide the preselected desired surface resistance for the finished carbon fiber sheet products; and wherein the temperature is within the range of about 370 degrees Centigrade to about 1300 degrees Centigrade for a predetermined time period dependent principally upon the mass of the homogenous partially carbonized sheet product.*

*34. A method according to claim 33, wherein the furnace used for the partial carbonizing process has a continuously increasing temperature profile over the duration of the carbonizing.*

*35. A method according to claim 34, wherein the furnace is a continuous line carbonizer divided into different temperature zones.*

*36. A method according to claim 35, wherein the continuous line carbonizer is divided into four temperature zones having operating temperatures of about 370 degrees Centigrade for the first zone, 650 degrees Centigrade for the second zone, 790 degrees Centigrade for the third zone and a temperature not exceeding about 1300 degrees Centigrade for the fourth zone, the temperature of the fourth zone being selected to control the surface electrical resistivity of the resulting partially carbonized fibers and thus the surface electrical resistance of the finished product.*

*37. A method according to claim 33 wherein the carbonizable fiber starting material comprises polyacrylonitrile.*

*38. A method according to claim 33 wherein the carbonizable fiber starting material is heated and drawn and then oxidized and stabilized before the partial carbonizing step.*

*39. A homogeneous partially carbonized carbon fiber product having a predetermined surface electrical resistance and substantially free of non-carbonized fiber filaments made by a process according to claim 33.*

*40. A homogeneous partially carbonized fiber sheet product free of non-carbonized fiber starting materials and having a homogeneous partially carbonized surface which exhibits a predesigned surface electrical resistance that is determined in advance by a predesigned partial carbonizing time/heat treatment of previously oxidized and stabilized non-carbonized fiber starting material and being the product of a partial carbonizing treatment designed to provide the resultant desired predetermined surface electrical resistance to the end product by being heated for a predetermined period of time at temperature values ranging between about 370 degrees Centigrade and about 1300 degrees Centigrade to provide a known preselected electrical volume resistivity to the partially carbonized fibers corresponding to that required to provide the preselected desired surface electrical resistance for the finished sheet products.*

* * * * *